United States Patent
Satoh

(12) 
(10) Patent No.: US 6,353,340 B1
(45) Date of Patent: Mar. 5, 2002

(54) INPUT AND OUTPUT CIRCUIT WITH REDUCED SKEW BETWEEN DIFFERENTIAL SIGNALS

(75) Inventor: Takehisa Satoh, Tokyo (JP)

(73) Assignee: Kawasaki Steel Corporation, Kobe (JP)

( * ) Notice: Subject to any disclaimer, the term of this patent is extended or adjusted under 35 U.S.C. 154(b) by 0 days.

(21) Appl. No.: 09/642,641

(22) Filed: Aug. 22, 2000

(30) Foreign Application Priority Data

Aug. 26, 1999 (JP) ........................................... 11-239788

(51) Int. Cl.[7] .............................................. H03K 19/20
(52) U.S. Cl. ........................... 326/121; 326/86; 326/83; 326/90; 327/239
(58) Field of Search ............................ 326/30, 83, 85, 326/86, 90; 327/112, 239; 375/316, 371; 333/22 R

(56) References Cited

U.S. PATENT DOCUMENTS

| | | | | |
|---|---|---|---|---|
| 5,672,991 A | * | 9/1997 | Thoma et al. | ............... 327/239 |
| 5,898,326 A | * | 4/1999 | Okayasu | ...................... 327/112 |
| 5,940,448 A | * | 8/1999 | Kuo | ............................ 375/316 |
| 6,208,161 B1 | * | 3/2001 | Suda | ............................ 326/30 |

* cited by examiner

Primary Examiner—Michael Tokar
Assistant Examiner—Vibol Tan
(74) Attorney, Agent, or Firm—Oliff & Berridge, PLC

(57) ABSTRACT

A differential-signal input and output circuit receives a pair of differential signals, and changes and outputs the pair of differential signals at almost the same time at timing when whichever changes last changes. In another differential-signal input and output circuit, when two input signals have a skew less than the delay period of delay circuits are input, the input and output circuit regards the input signals as differential signals and operates as a circuit for reducing the skew. When the skew is equal to or more than the delay period, the input and output circuit operates as an input-signal buffer.

16 Claims, 6 Drawing Sheets

| A | B | C | D |
|---|---|---|---|
| 0 | 0 | Hiz | Hiz |
| 0 | 1 | 1 | 0 |
| 1 | 0 | 0 | 1 |
| 1 | 1 | Hiz | Hiz |

| A | B | A' | B' |
|---|---|----|----|
| 0 | 0 | -  | -  |
| 0 | 1 | 0  | 1  |
| 1 | 0 | 1  | 0  |
| 1 | 1 | -  | -  |

INPUT AND OUTPUT CIRCUIT WITH REDUCED SKEW BETWEEN DIFFERENTIAL SIGNALS

BACKGROUND OF THE INVENTION

1. Field of the Invention

The present invention relates to differential-signal input and output circuits suited to improve the skew between a pair of differential signals, such as that in the Universal Serial Bus (USB), which transfers differential signals having opposite logic levels.

2. Description of the Related Art

To unify the standards of connectors provided for modules used with a personal computer, such as a display, a keyboard, or a mouse, the USB has been employed in these days. Between these modules and a personal computer, a series of packet data is transferred through the USB by using a pair of differential signals having opposite logic levels. Since data is transferred in serial in the USB, a few wires are required. The USB uses a cable having four wires for a pair of differential signal lines, a power line, and a ground line. Therefore, each module needs a connector having only a few pins, and in addition, the diameter of a cable connected to the connector is relatively small. In the USB, since data is transferred by a pair of differential signals, noise components having the same phase are eliminated. In the USB, to identify packet data, signals having logical "0" are inserted for a predetermined period between adjacent packet data.

FIG. 8 is a view showing the signal waveforms of the USB.

As shown in FIG. 8, it is required in the USB that a crossover voltage $V_{CR}$, the voltage at the point where two differential signals having opposite logic levels intersect when one of them rises and the other falls, fall in a very narrow voltage zone (between $V_{CRL}$ and $V_{CRH}$ in the figure).

If a timing shift (hereinafter called a skew) is large between the differential signals, it is difficult for a module which receives the differential signals to obtain the correct packet data, and a transfer error of packet data may occur. To avoid this error, a differential-signal output circuit for reducing the skew of differential signals and for outputting them to the USB, or a receiver for reducing the skew of differential signals, generated during signal propagation are required.

FIG. 9 is a view of an example circuit for generating differential signals having a small skew. FIG. 10 is a view showing the operation waveforms of the circuit shown in FIG. 9.

The circuit shown in FIG. 9 includes an input terminal 113, an inverter 111 connected to the input terminal 113, an inverter 112 connected to the output side of the inverter 111, an output terminal 114 connected to the output side of the inverter 112, and an output terminal 115 connected to the connection point of the inverter 111 and the inverter 112.

A signal A shown in FIG. 10 is input to the inverter 111 through the input terminal 113. The inverter 111 inverts the input signal A in logic to generate a signal B' shown in FIG. 10. The generated signal B' is output to the outside through the output terminal 115 and is also input to the inverter 112. The inverter 112 inverts the input signal B' in logic to generate a signal A'. The generated signal A' is output to the outside through the output terminal 114. In this way, differential signals A' and B' having a small skew of only the delay time of the inverter 112 are output to the outside.

However, in the above circuit, a signal required to identify packet data, such as both signals A' and B' having a logical "0" for a predetermined period, cannot be output to the outside although the differential signals having a small skew can be output.

Also, if a large skew occurs between a pair of differential signals due to signal transfer, data is recognized incorrectly. Therefore, a circuit for reducing a skew generated during signal propagation is demanded.

SUMMARY OF THE INVENTION

The present invention has been made in consideration of the above circumstances. Accordingly, it is an object of the present invention to provide a differential-signal input and output circuit for outputting differential signals having a small skew and for outputting signals both having logical "0" or "1" in addition to the differential signals. Another object of the present invention is to provide a differential-signal input and output circuit for reducing the skew of differential signals, generated during propagation.

One of the foregoing objects is achieved through the provision of a differential-signal input and output circuit for receiving a pair of differential signals at first and second input terminals, and for changing and outputting the pair of differential signals almost at the same time at timing when whichever changes last changes.

In this differential-signal input and output circuit, two differential signals are changed and output almost at the same time at timing when whichever changes last changes. Therefore, even when two differential signals having a relatively large skew are input, differential signals having a relatively small skew are output, and thus, the skew of the two input signals is reduced.

Another of the foregoing objects is achieved through the provision of a differential-signal input and output circuit including two transistor groups each formed of two p-channel transistors and two n-channel transistors connected in series in this order from a power to the ground; a first input terminal connected to the gate of a first p-channel transistor of the two p-channel transistors constituting a first transistor group and to the gate of a first n-channel transistor of the two n-channel transistors constituting the first transistor group; a first output terminal connected to a first connection point of a p-channel transistor closer to the ground of the two p-channel transistors constituting the first transistor group and an n-channel transistor closer to the power of the two n-channel transistors constituting the first transistor group; a second input terminal connected to the gate of a second p-channel transistor of the two p-channel transistors constituting a second transistor group and to the gate of a second n-channel transistor of the two n-channel transistors constituting the second transistor group; a second output terminal connected to a connection point of a p-channel transistor closer to the ground of the two p-channel transistors constituting the second transistor group and an n-channel transistor closer to the power of the two n-channel transistors constituting the second transistor group; a first inverter whose input side is connected to the second input terminal and whose output side is connected to both of the gate of a third p-channel transistor of the two p-channel transistors constituting the first transistor group, other than the first p-channel transistor, and the gate of a third n-channel transistor of the two n-channel transistors constituting the first transistor group, other than the first n-channel transistor; and a second inverter whose input side is connected to the first input terminal and whose output side is connected to both of the gate of a fourth p-channel transistor of the two p-channel transistors constituting the second transistor group, other than the second p-channel transistor, and the gate of a fourth n-channel transistor of the two n-channel transistors constituting the second transistor group, other than the second n-channel transistor.

In this differential-signal input and output circuit, when two signals having opposite logic levels are input to the first and second input terminals, signals having the opposite logic levels obtained by inverting those of the input signals are output from the first and second output terminals. When two signals having the same logic level are input to the first and second input terminals, the first and second output terminals show a high-impedance state.

The differential-signal input and output circuit may be configured such that it further includes a first latch whose input side is connected to the first output terminal and a second latch whose input side is connected to the second output terminal; and the output point of the first latch serves as the first output terminal, and the output point of the second latch serves as the second output terminal.

In this case, the logical states of the first and second output terminals are maintained at the first and second latches. Therefore, even when the first and second output terminals show the high-impedance states, stable logic signals are output.

One of the foregoing objects is achieved in still another aspect of the present invention through the provision of a differential-signal input and output circuit for receiving two differential signals having opposite logic levels at first and second input terminals, wherein the differential-signal input and output circuit changes and outputs the two differential signals almost at the same time at timing when whichever changes last changes when the skew between the two differential signals is less than a delay period specified by a delay circuit, and the differential-signal input and output circuit operates as just a buffer when the skew between the two differential signals is equal to or more than the delay period specified by the delay circuit.

In this differential-signal input and output circuit, differential signals having a small skew are output, and signals both having logical "0" or logical "1" can be output, other than differential signals.

One of the foregoing objects is achieved in yet another aspect of the present invention through the provision of a differential-signal input and output circuit including four transistor groups each formed of two p-channel transistors and two n-channel transistors connected in series in this order from a power to the ground; a first input terminal connected to all of the gate of a first p-channel transistor of the two p-channel transistors constituting a first transistor group among the four transistor groups, the gate of a first n-channel transistor of the two n-channel transistors constituting the first transistor group, the gate of a second p-channel transistor of the two p-channel transistors constituting a second transistor group among the four transistor groups, and the gate of a second n-channel transistor of the two n-channel transistors constituting the second transistor group; a first output terminal connected to both of a first connection point of a p-channel transistor closer to the ground of the two p-channel transistors constituting the first transistor group and an n-channel transistor closer to the power of the two n-channel transistors constituting the first transistor group, and a second connection point of a p-channel transistor closer to the ground of the two p-channel transistors constituting the second transistor group and an n-channel transistor closer to the power of the two n-channel transistors constituting the second transistor group; a second input terminal connected to all of the gate of a third p-channel transistor of the two p-channel transistors constituting a third transistor group among the four transistor groups, the gate of a third n-channel transistor of the two n-channel transistors constituting the third transistor group, the gate of a fourth p-channel transistor of the two p-channel transistors constituting a fourth transistor group among the four transistor groups, and the gate of a fourth n-channel transistor of the two n-channel transistors constituting the fourth transistor group; a second output terminal connected to both of a third connection point of a p-channel transistor closer to the ground of the two p-channel transistors constituting the third transistor group and an n-channel transistor closer to the power of the two n-channel transistors constituting the third transistor group, and a fourth connection point of a p-channel transistor closer to the ground of the two p-channel transistors constituting the fourth transistor group and an n-channel transistor closer to the power of the two n-channel transistors constituting the fourth transistor group; a first inverter whose input side is connected to the second input terminal and whose output side is connected to both of the gate of a fifth p-channel transistor of the two p-channel transistors constituting the first transistor group, other than the first p-channel transistor, and the gate of a fifth n-channel transistor of the two n-channel transistors constituting the first transistor group, other than the first n-channel transistor; a first delay circuit whose input side is connected to the first input terminal and whose output side is connected to both of the gate of a sixth p-channel transistor of the two p-channel transistors constituting the second transistor group, other than the second p-channel transistor, and the gate of a sixth n-channel transistor of the two n-channel transistors constituting the second transistor group, other than the second n-channel transistor; a second inverter whose input side is connected to the first input terminal and whose output side is connected to both of the gate of a seventh p-channel transistor of the two p-channel transistors constituting the third transistor group, other than the third p-channel transistor, and the gate of a seventh n-channel transistor of the two n-channel transistors constituting the third transistor group, other than the third n-channel transistor; and a second delay circuit whose input side is connected to the second input terminal and whose output side is connected to both of the gate of an eighth p-channel transistor of the two p-channel transistors constituting the fourth transistor group, other than the fourth p-channel transistor, and the gate of an eighth n-channel transistor of the two n-channel transistors constituting the fourth transistor group, other than the fourth n-channel transistor.

In this differential-signal input and output circuit, two signals having opposite logic levels are input to the first and second input terminals. When the skew of the two input signals are less than the delay period of the first and second delay circuits, since the two signals are changed and output at the same time at timing when whichever of the two signals changes last changes, differential signals having a small skew are output. When the skew of the two input signals is equal to or more than the delay period of the first and second delay circuits, the input signals are output as they are. Therefore, the skew of differential signals is reduced, and signals, such as those having logical "0" for a predetermined period, required to identify packet data, are obtained.

It is preferred that a first latch whose input side is connected to both of the first connection point and the second connection point and a second latch whose input side is connected to both of the third connection point and the fourth connection point be provided, the first output terminal be connected to the output side of the first latch instead of to the first and second connection points, and the second output terminal be connected to the output side of the second latch instead of to the third and fourth connection points.

In this case, because the logical state of the first and second connection points is maintained by the first latch, and the logical state of the third and fourth connection points is maintained by the second latch, even when the first and second connection points or the third and fourth connection points show the high-impedance state, the logical states of the first and second output terminals are stable.

DESCRIPTION OF THE PREFERRED EMBODIMENTS

Figures 1, 2:
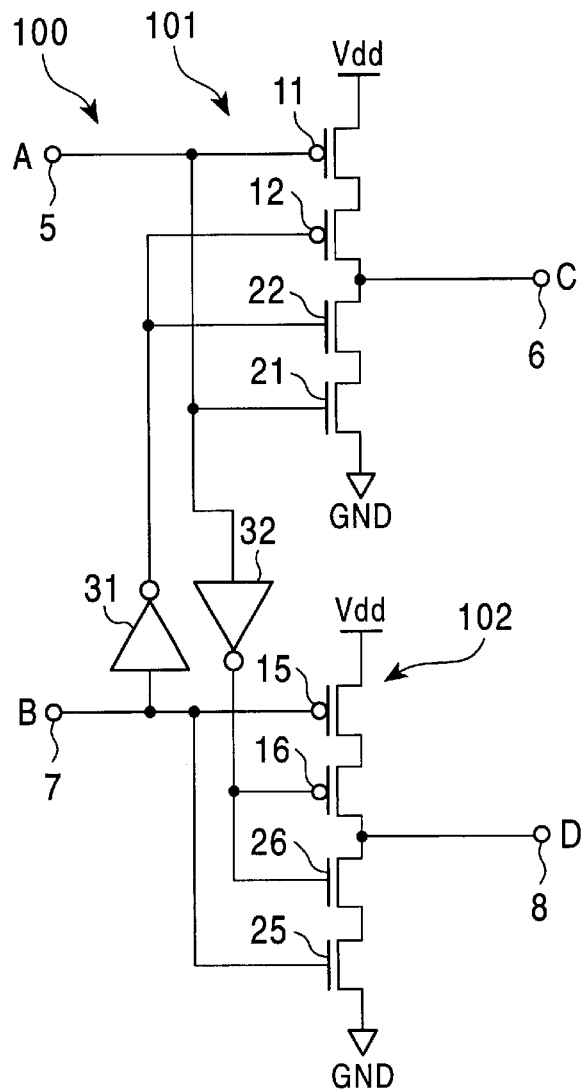
FIG. 1 is a view of a differential-signal input and output circuit according to a first embodiment of the present invention.
FIG. 2 is a view of the truth table of the differential-signal input and output circuit shown in FIG. 1.

FIG. 1 is a view of a differential-signal input and output circuit according to a first embodiment of the present invention.

The differential-signal input and output circuit 100 shown in FIG. 1 has two transistor groups 101 and 102.

A first transistor group 101 is formed of a p-channel transistor 11, a p-channel transistor 12, an n-channel transistor 22, and an n-channel transistor 21 connected in series in this order from a power Vdd to the ground GND.

A second transistor group 102 is formed of a p-channel transistor 15, a p-channel transistor 16, an n-channel transistor 26, and an n-channel transistor 25 connected in series in this order from the power Vdd to the ground GND.

The differential-signal input and output circuit 100 is provided with a first input terminal 5 connected to the connection point of the gate of the p-channel transistor 11, which is one of the two p-channel transistors 11 and 12 constituting the first transistor group 101, and the gate of the n-channel transistor 21, which is one of the two n-channel transistors 22 and 21 constituting the first transistor group 101.

The differential-signal input and output circuit 100 is also provided with a first output terminal 6 connected to the connection point of the p-channel transistor 12, which is closer to the ground GND of the two p-channel transistors 11 and 12 constituting the first transistor group 101, and the n-channel transistor 22, which is closer to the power Vdd of the two n-channel transistors 22 and 21 constituting the first transistor group 101.

The differential-signal input and output circuit 100 is further provided with a second input terminal 7 connected to the connection point of the gate of the p-channel transistor 15, which is one of the two p-channel transistors 15 and 16 constituting the second transistor group 102, and the gate of the n-channel transistor 25, which is one of the two n-channel transistors 26 and 25 constituting the second transistor group 102.

The differential-signal input and output circuit 100 is still further provided with a second output terminal 8 connected to the connection point of the p-channel transistor 16, which is closer to the ground GND of the two p-channel transistors 15 and 16 constituting the second transistor group 102, and the n-channel transistor 26, which is closer to the power Vdd of the two n-channel transistors 26 and 25 constituting the second transistor group 102.

The differential-signal input and output circuit 100 includes a first inverter 31 whose input side is connected to the second input terminal 7 and whose output side is connected to both the gate of the p-channel transistor 12 constituting the first transistor group 101 and the gate of the n-channel transistor 22 constituting the first transistor group 101.

The differential-signal input and output circuit 100 also includes a second inverter 32 whose input side is connected to the first input terminal 5 and whose output side is connected to both the gate of the p-channel transistor 16 constituting the second transistor group 102 and the gate of the n-channel transistor 26 constituting the second transistor group 102.

FIG. 2 is a view of the truth table of the differential-signal input and output circuit shown in FIG. 1.

Four types, (1) to (4), of combinations of signals A and B are input to the differential-signal input and output circuit 100 shown in FIG. 1. According to the truth table shown in FIG. 2, the operation of the differential-signal input and output circuit 100 will be described below.

In the combination (1), signals A and B both having logical "0" are input to the first and second input terminals 5 and 7. A signal C at the first output terminal 6 and a signal D at the second output terminal 8 both show high impedance (Hiz).

In the combination (2), the signal A having logical "0" and the signal B having logical "1" are input to the first and second input terminals 5 and 7. The signal C having logical "1" is output from the first output terminal 6 and the signal D having logical "0" is output from the second output terminal 8.

In the combination (3), the signal A having logical "1" and the signal B having logical "0" are input to the first and second input terminals 5 and 7. The signal C having logical "0" is output from the first output terminal 6 and the signal D having logical "1" is output from the second output terminal 8.

In the combination (4), the signals A and B both having logical "1" are input to the first and second input terminals 5 and 7. The signal C at the first output terminal 6 and the signal D at the second output terminal 8 both show high impedance (Hiz).

By referring to FIG. 3, the dynamic operation of the circuit, obtained when a pair of differential signals having a skew (time delay td) is input to the input terminals 5 and 7 will be described next.

Figure 3:
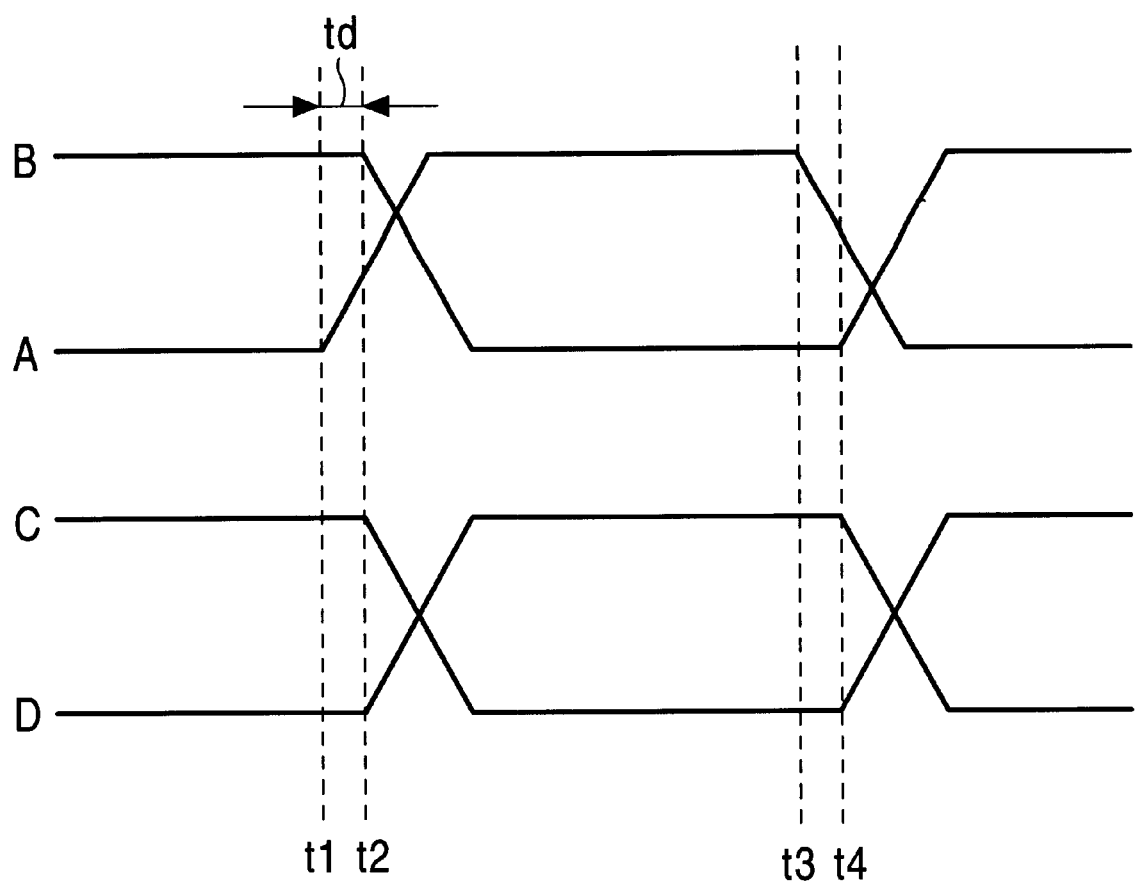
FIG. 3 is a view of operation waveforms of the differential-signal input and output circuit according to the first embodiment of the present invention.

FIG. 3 is a view showing the waveforms of the output signals C and D of the differential-signal input and output circuit 100, obtained when a pair of differential signals A and B having a skew (time delay td) is input to the input terminals 5 and 7.

At first, the signal A is logical "0" (hereinafter called an L level) and the signal B is logical "1" (hereinafter called an H level). This condition corresponds to the combination (2) shown in FIG. 2. Since the p-channel transistors 11 and 12 are both on and the n-channel transistors 21 and 22 are both off, the output signal C has the H level. Since the p-channel transistors 15 and 16 are both off and the n-channel transistors 25 and 26 are both on, the output signal D has the L level. When the signal A rises at a time t1, the p-channel transistor 11 changes its state from on to off and the n-channel transistor 21 changes its state from off to on. Because the input signal B remains as it was before, the p-channel transistor 12 maintains the on state and the n-channel transistor 22 maintains the off state. Therefore, the output signal C changes its state to the high-impedance state. Due to a parasitic capacitor at the node of the output C, the output signal C maintains the H level for a while. When the input signal B starts falling at a time t2, the output of the inverter 31 starts rising, the p-channel transistor 12 changes to the off state, and the n-channel transistor 22 changes to the on state. Therefore, when the delay time of the inverter 31 is ignored, the output signal C changes its state from the H level to the L level at this time.

Since the p-channel transistor 16 changes its state from off to on and the n-channel transistor 26 changes its state from on to off at the time t1 due to the change of the input signal A, the p-channel transistor 15 changes from the off state to the on state and the n-channel transistor 25 changes from the on state to the off state when the input signal B starts rising. The output signal D changes from the L level to the H level.

In the same way, even when the input signal A starts falling at a time t3, the output signals C and D do not change. When the input signal B, which changes its state with a delay, rises at a time t4, the output signals C and D change their states.

As described above, in the differential-signal input and output circuit 100, a pair of input differential signals having a skew is changed and output almost at the same time at timing when whichever of the two input signals changes last changes.

Figures 4, 5:
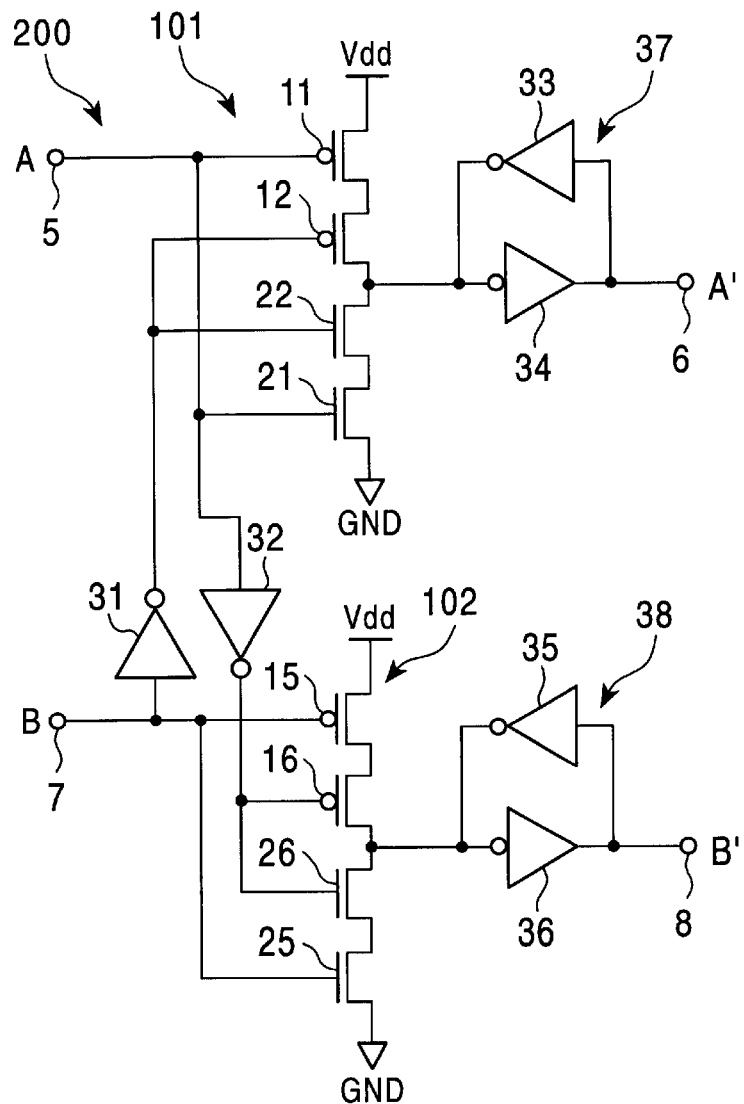
FIG. 4 is a circuit diagram of the differential-signal input and output circuit according to the first embodiment of the present invention in which a latch circuit is added to each output.
FIG. 5 is a view of the truth table of the differential-signal input and output circuit shown in FIG. 4.

FIG. 4 is a view of the differential-signal input and output circuit according to the first embodiment of the present invention, to which a latch circuit is connected at each output. FIG. 5 is a view of the truth table of the differential-signal input and output circuit shown in FIG. 4.

The differential-signal input and output circuit 200 shown in FIG. 4 differs in structure from the differential-signal input and output circuit 100 shown in FIG. 1 in that a first latch 37 is connected to the output of the first transistor group 101 constituting the differential-signal input and output circuit 100 and a second latch 38 is connected to the output of the second transistor group 102.

The first latch 37 is formed of an inverter 33 and an inverter 34. The second latch 38 is formed of an inverter 35 and an inverter 36. With these first and second latches 37 and 38 provided, because the logical states of the first and second output terminals 6 and 8 are maintained by these first and second latches 37 and 38, even if the signals (signals C and D shown in FIG. 1) output from the first and second transistor groups 101 and 102 have the high-impedance state, signals A' and B' which have been output continue being output as shown in the truth table of FIG. 5.

Figure 6:
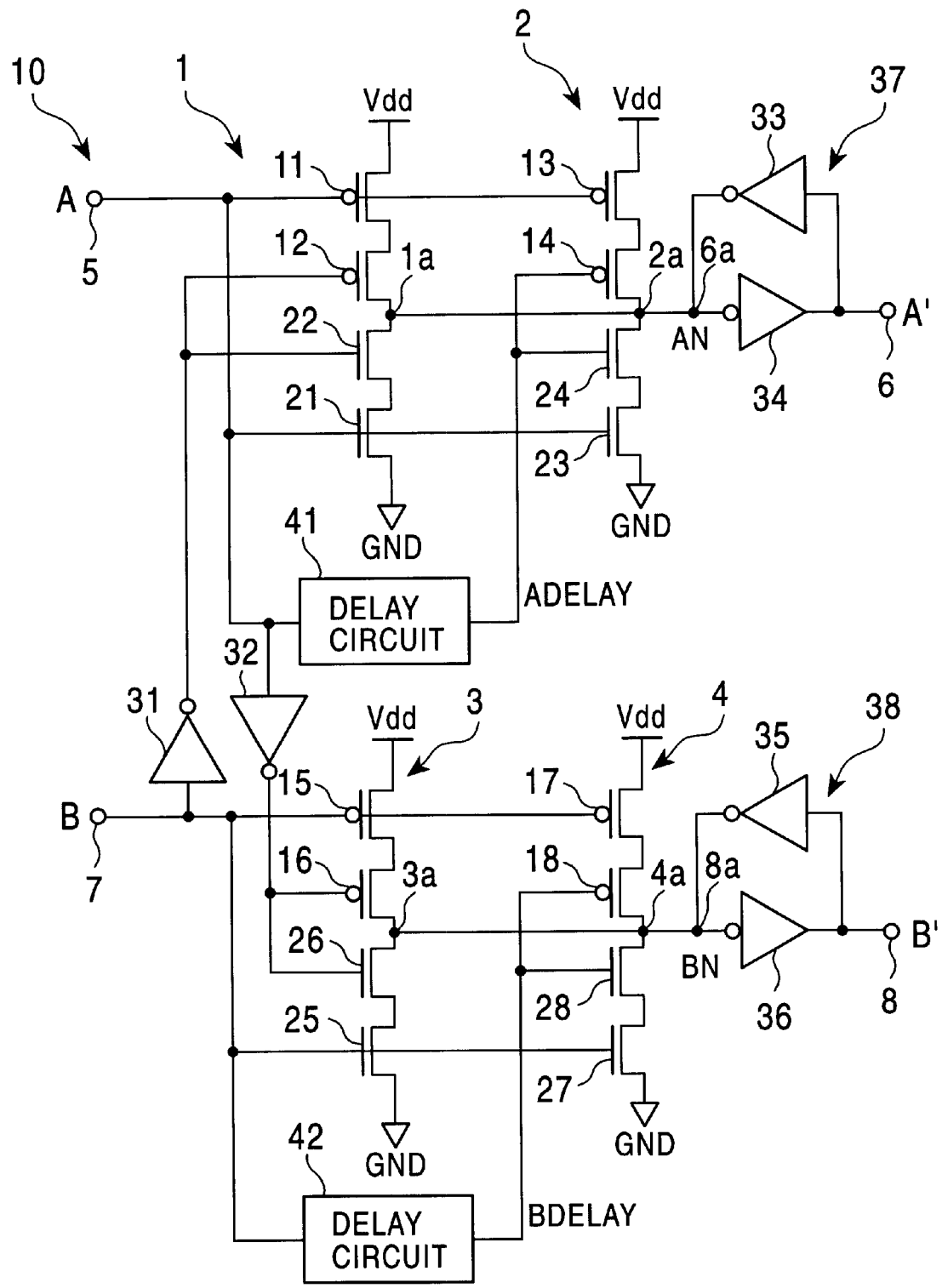
FIG. 6 is a circuit diagram of a differential-signal input and output circuit according to a second embodiment of the present invention.

FIG. 6 is a circuit diagram of a differential-signal input and output circuit according to a second embodiment of the present invention.

This circuit can be used as an output buffer for outputting differential signals to a USB, as an input buffer circuit of a receiver circuit for receiving differential signals from a USB, and as a circuit for reducing the skew of differential signals.

The differential-signal output circuit 10 shown in FIG. 6 includes four transistor groups 1, 2, 3, and 4.

The first transistor group 1 is formed of p-channel transistors 11 and 12 and n-channel transistors 22 and 21 connected in series in this order from a power Vdd to the ground GND.

The second transistor group 2 is formed of p-channel transistors 13 and 14 and n-channel transistors 24 and 23 connected in series in this order from the power Vdd to the ground GND.

The third transistor group 3 is formed of p-channel transistors 15 and 16 and n-channel transistors 26 and 25 connected in series in this order from the power Vdd to the ground GND.

The fourth transistor group 4 is formed of p-channel transistors 17 and 18 and n-channel transistors 28 and 27 connected in series in this order from the power Vdd to the ground GND.

The differential-signal input and output circuit 10 is provided with a first input terminal 5 connected to all of the gate of the p-channel transistor 11, which is one of the two p-channel transistors 11 and 12 constituting the first transistor group 1, the gate of the n-channel transistor 21, which is one of the two n-channel transistors 22 and 21 constituting the first transistor group 1, the gate of the p-channel transistor 13, which is one of the two p-channel transistors 13 and 14 constituting the second transistor group 2, and the gate of the n-channel transistor 23, which is one of the two n-channel transistors 24 and 23 constituting the second transistor group 2.

The differential-signal input and output circuit 10 is also provided with a first connection point 1a connected to the p-channel transistor 12, which is closer to the ground GND of the two p-channel transistors 11 and 12 constituting the first transistor group 1, and to the n-channel transistor 22, which is closer to the power Vdd of the two n-channel transistors 22 and 21 constituting the first transistor group 1; a second connection point 2a connected to the p-channel transistor 14, which is closer to the ground GND of the two p-channel transistors 13 and 14 constituting the second transistor group 2, and to the n-channel transistor 24, which is closer to the power Vdd of the two n-channel transistors 24 and 23 constituting the second transistor group 2; and a sixth connection point 6a connected to both the first and second connection points 1a and 2a.

The differential-signal input and output circuit 10 is further provided with a second input terminal 7 connected to all of the gate of the p-channel transistor 15, which is one of the two p-channel transistors 15 and 16 constituting the third transistor group 3, the gate of the n-channel transistor 25, which is one of the two n-channel transistors 26 and 25 constituting the third transistor group 3, the gate of the p-channel transistor 17, which is one of the two p-channel transistors 17 and 18 constituting the fourth transistor group 4, and the gate of the n-channel transistor 27, which is one of the two n-channel transistors 28 and 27 constituting the fourth transistor group 4.

The differential-signal input and output circuit 10 is still further provided with a third connection point 3a connected to the p-channel transistor 16, which is closer to the ground GND of the two p-channel transistors 15 and 16 constituting the third transistor group 3, and to the n-channel transistor 26, which is closer to the power Vdd of the two n-channel transistors 26 and 25 constituting the third transistor group 3; a fourth connection point 4a connected to the p-channel transistor 18, which is closer to the ground GND of the two p-channel transistors 17 and 18 constituting the fourth transistor group 4, and to the n-channel transistor 28, which is closer to the power Vdd of the two n-channel transistors 28 and 27 constituting the fourth transistor group 4; and an eighth connection point 8a connected to both the third and fourth connection points 3a and 4a.

The differential-signal input and output circuit 10 includes a first inverter 31 whose input side is connected to the second input terminal 7 and whose output side is connected to both the gate of the p-channel transistor 12 constituting the first transistor group 1 and the gate of the n-channel transistor 22 constituting the first transistor group 1.

The differential-signal input and output circuit 10 also includes a first delay circuit 41 whose input side is connected to the first input terminal 5 and whose output side is connected to both the gate of the p-channel transistor 14 constituting the second transistor group 2 and the gate of the n-channel transistor 24 constituting the second transistor group 2. The first delay circuit 41 has a predetermined delay period.

The differential-signal input and output circuit 10 further includes a second inverter 32 whose input side is connected to the first input terminal 5 and whose output side is connected to both the gate of the p-channel transistor 16 constituting the third transistor group 3 and the gate of the n-channel transistor 26 constituting the third transistor group 3.

The differential-signal input and output circuit 10 still further includes a second delay circuit 42 whose input side is connected to the second input terminal 7 and whose output side is connected to both the gate of the p-channel transistor 18 constituting the fourth transistor group 4 and the gate of the n-channel transistor 28 constituting the fourth transistor group 4. The second delay circuit 42 has the same delay period as the first delay circuit 41.

As the first and second delay circuits 41 and 42, a circuit formed of inverters connected in a plurality of even-numbered stages can be used. Depending on the number of stages, the delay period changes.

When the input side of the delay circuit 41 is connected to the output side of the second inverter 32 instead of to the first input terminal, and the input side of the delay circuit 42 is connected to the output side of the first inverter 31 instead of to the second input terminal, the number of inverters constituting each delay circuit is reduced by one for the same delay period. In this case, each of the delay circuits 41 and 42 is formed of inverters connected in a plurality of odd-numbered stages.

The differential-signal input and output circuit 10 yet further includes a first latch 37 whose input side is connected to both the first connection point 1a and the second connection point 2a and which is formed of inverters 33 and 34, and a second latch 38 whose input side is connected to both the third connection point 3a and the fourth connection point 4a and which is formed of inverters 35 and 36.

The differential-signal input and output circuit 10 also includes a first output terminal 6 connected to the output side of the first latch 37, and a second output terminal 8 connected to the output side of the second latch 38.

The structures of the latch circuits 37 and 38 are not limited to those described above. Other types of latch circuits can be used, such as that formed of two inverters connected in series, in which the output of a second inverter is fed back to the input of a first inverter and an input terminal is Just connected to the output of the differential-signal input and output circuit.

The operation of the differential-signal input and output circuit 10 will be described below by referring to FIG. 6 and FIG. 7.

Figure 7:
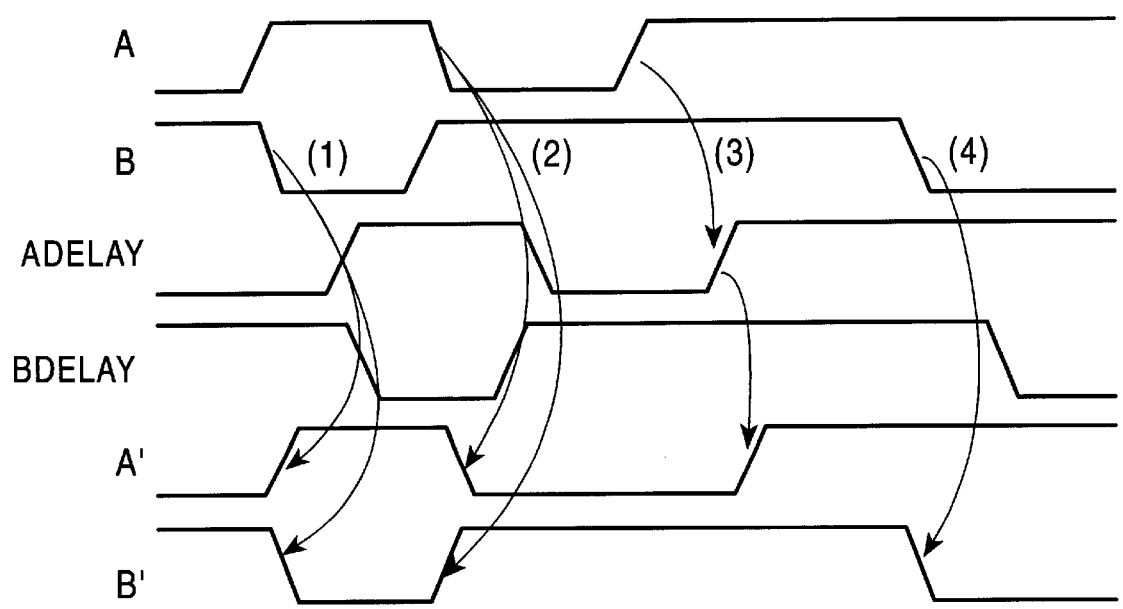
FIG. 7 is a view of operation waveforms of the differential-signal input and output circuit shown in FIG. 6.
Figure 8:
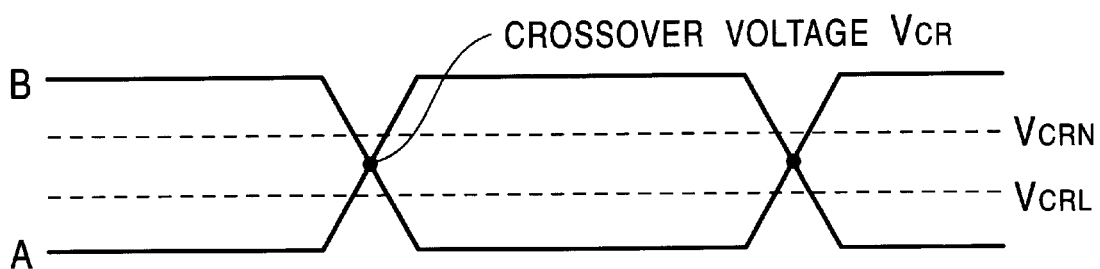
FIG. 8 is a view showing a USB signal waveform.
Figure 9:
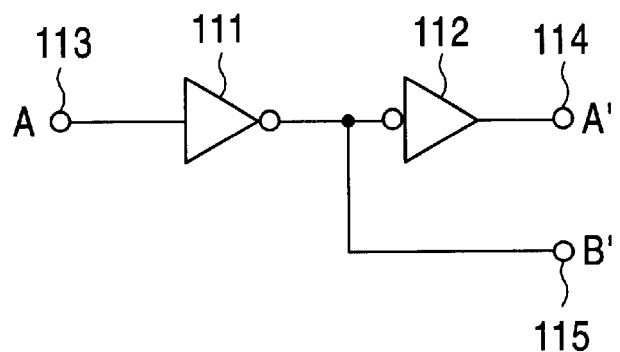
FIG. 9 is a view of an example circuit for generating differential signals having a small skew.
Figure 10:
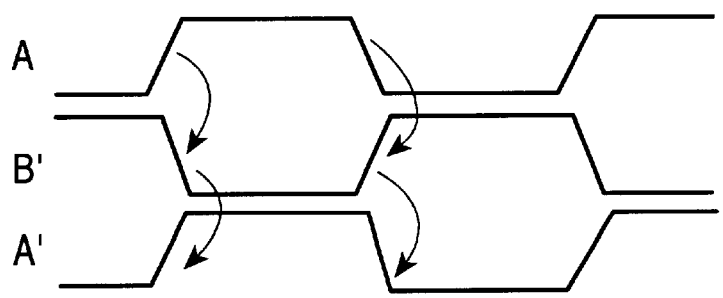
FIG. 10 is a view of the operation waveform of the circuit shown in FIG. 9.

FIG. 7 is a view of the operation waveforms of the differential-signal input and output circuit 10 shown in FIG. 6.

The operation of the differential-signal input and output circuit 10 shown in FIG. 6 is divided into four transitions, (1) to (4), shown in FIG. 7. Details will be described below.

At a start point of time, signals A and B having logical "0" and logical "1" are input to the first and second input terminals 5 and 7, as shown in FIG. 7. Since the signal A having logical "0" is input to the p-channel transistor 11 and to the n-channel transistor 21 in the first transistor group 1, the p-channel transistor 11 is on and the n-channel transistor 21 is off. Since the signal B having logical "0" is input through the first inverter 31 to the p-channel transistor 12 and to the n-channel transistor 22, the p-channel transistor 12 is on and the n-channel transistor 22 is off. Because the p-channel transistors 11 and 12 are both on and the n-channel transistors 22 and 21 are both off, the first connection point 1a of the first transistor group 1 is in the logical "1" state.

Since the signal A having logical "0" is input to the p-channel transistor 13 and to the n-channel transistor 23 in the second transistor group 2, the p-channel transistor 13 is on and the n-channel transistor 23 is off. Since a signal ADELAY having logical "0" is input through the first delay circuit 41 to the p-channel transistor 14 and to the n-channel transistor 24, the p-channel transistor 14 is on and the n-channel transistor 24 is off. Therefore, the second connection point 2a is also in the logical "1" state as the first connection point 1a. Consequently, a signal AN at the sixth connection point 6a, which is connected to the first connection point 1a and to the second connection point 2a, also shows logical "1." This logical "1" signal is inverted by the first latch 37. A signal A' having logical "0" is output from the first output terminal 6.

Since the signal B having logical "1" is input to the p-channel transistor 15 and to the n-channel transistor 25 in the third transistor group 3, the p-channel transistor 15 is off and the n-channel transistor 25 is on. Since the signal A having logical "1" is input through the second inverter 32 to the p-channel transistor 16 and to the n-channel transistor 26, the p-channel transistor 16 is off and the n-channel transistor 26 is on. Because the p-channel transistors 15 and 16 are both off and the n-channel transistors 26 and 25 are both on, the third connection point 3a is in the logical "0" state. Since the signal B having logical "1" is input to the p-channel transistor 17 and to the n-channel transistor 27 in the fourth transistor group 4, the p-channel transistor 17 is off and the n-channel transistor 27 is on. Since a signal BDELAY having logical "1" is input through the second delay circuit 42 to the p-channel transistor 18 and to the n-channel transistor 28, the p-channel transistor 18 is off and the n-channel transistor 28 is on. Therefore, the fourth connection point 4a is also in the logical "0" state as the third connection point 3a. Consequently, a signal BN at the eighth connection point 8a, which is connected to the third connection point 3a and to the fourth connection point 4a, also shows logical "0." This logical-"0" signal is inverted by the second latch 38. A signal B' having logical "1" is output from the second output terminal 8.

In these conditions, the transition (1) shown in FIG. 7 is achieved. In this transition, the signal A changes from logical "0" to logical "1" and then the signal B changes from logical "1" to logical "0" within less than the delay period of the first and second delay circuits.

As shown in FIG. 7, the signal A changes from logical "0" to logical "1" first. Then, in the first transistor group 1, the p-channel transistor 11 is turned off among the p-channel transistors 11 and 12 which are on, and the n-channel transistor 21 is turned on among the n-channel transistors 22 and 21 which are off. Therefore, the first connection point 1a shows a high-impedance state (hereinafter called a Hiz state). In the second transistor group 2, the p-channel transistor 13 is turned off among the p-channel transistors 13 and 14 which are on, and the n-channel transistor 23 is turned on among the n-channel transistors 24 and 23 which are off. Therefore, the second connection point 2a also shows the Hiz state. Because the first connection point 1a and the second connection point 2a show the Hiz state, the first latch 37 does not change its state, and therefore, the signal A' having logical "0" continues being output from the first output terminal 6.

In the third transistor group 3, since the signal A having logical "0" is input through the second inverter 32, the n-channel transistor 26 is turned off among the n-channel transistors 26 and 25 which are on, and the p-channel transistor 16 is turned on among the p-channel transistors 15 and 16 which are off. Therefore, the third connection point 3a shows the Hiz state. Because the state of each transistor in the fourth transistor group 4 does not change, the fourth connection point 4a has logical "0" and the state of the second latch 38 does not change. Consequently, the signal B' having logical "1" continues being output from the second output terminal 8. In this way, when the signal A changes its state from logical "0" to logical "1" the logical states of the signals A' and B' do not change.

Before the delay period of the first and second delay circuits 41 and 42 elapses, the signal B changes its state from logical "1" to logical "0." The signal B which has been changed to the logical "0" state is input to the n-channel transistor 25 and the p-channel transistor 15 in the third transistor group 3. The n-channel transistor 25 goes off and the p-channel transistor 15 goes on. Since the signal A having logical "0" is input through the second inverter 32 to the p-channel transistor 16 and the n-channel transistor 26, the p-channel transistor 16 is on the n-channel transistor 26 is off. Because the p-channel transistors 15 and 16 are on and the n-channel transistors 26 and 25 are off, the state of the third connection point 3a is changed from the Hiz state to the logical "1" state. In addition, since the signal B which has been changed to logical "0" is input to the n-channel transistor 27 and the p-channel transistor 17 in the fourth transistor group 4, the n-channel transistor 27 goes off and the p-channel transistor goes on. Since the signal B has changed from logical "1" to logical "0" before the delay period elapses, the signal BDELAY having logical "1" continues being input through the second delay circuit 42 to the p-channel transistor 18 and the n-channel transistor 28. Therefore, the p-channel transistor 18 is off and the n-channel transistor 28 is on. Because the p-channel transistors 17 and 18 are on and off, respectively, and the n-channel transistors 25 and 27 are on and off, respectively, the state of the fourth connection point 4a is changed to the Hiz state. Therefore, a signal BN at the eighth connection point 8a, connected to the third connection point 3a and the fourth connection point 4a, has logical "1." The signal BN having logical "1" is inverted by the second latch circuit 38. The signal B' changes its state from logical "1" to logical "0."

The signal B having logical "1" is input through the first inverter 31 to the p-channel transistor 12 and to the n-channel transistor 22 of the first transistor group 1. The p-channel transistor 12 goes off and the n-channel transistor 22 goes on. Since the signal A having logical "1" is input to the p-channel transistor 11 and the n-channel transistor 21 in the first transistor group 1, the p-channel transistor 11 is in the off state and the n-channel transistor 21 is in the on state. Because the p-channel transistors 11 and 12 are both off and the n-channel transistors 22 and 21 are both on, the first connection point 1a has logical "0." Since the second connection point 2a is in the Hiz state, the signal AN at the sixth connection point 6a, which is connected to the first connection point 1a and the second connection point 2a, is logical "0." The signal AN having logical "0" is inverted by the first latch circuit 37. The signal A' is changed from logical "0" to logical "1." In this way, in the transition (1), due to the skew between the signals A and B, the signal A changes from logical "0" to logical "1" first, and then the signal B changes from logical "1" to logical "0." In this case, when the signal A changes from logical "0" to logical "1," the states of the output signals A' and B' do not change and remain as they are. When the signal B is changed from logical "1" to logical "0," the states of the output signals A' and B' are changed. After a predetermined delay period, the signal ADELAY having logical "1" and the signal BDELAY having logical "0" are output from the first and second delay circuits 41 and 42, as shown in FIG. 6.

Next, the transition (2) shown in FIG. 7 is achieved. In this transition, the signal B is changed from logical "0" to logical "1" first, and then, the signal A is changed from logical "1" to logical "0" before the delay period of the first and second delay circuits 41 and 42 elapses. In the third transistor group 3, the p-channel transistor 15 is turned off among the p-channel transistors 15 and 16 which are on, and the n-channel transistor 25 is turned on among the n-channel transistors 26 and 25 which are off. Therefore, the third connection point 3a shows the Hiz state. In the fourth transistor group 4, the p-channel transistor 17 is turned off, and the n-channel transistor 27 is turned on. Since the BDELAY signal having logical "0" is input from the second delay circuit 42 to the p-channel transistor 18 and to the n-channel transistor 28, the p-channel transistor 18 is on and the n-channel transistor 28 is off. Therefore, the fourth connection point 4a also shows the Hiz state. When the signal B is changed from logical "0" to logical "1" the state of the signal B' is not changed.

In the first transistor group 1, since the signal B having logical "0" is input through the first inverter 31, the n-channel transistor 22 is turned off among the n-channel transistors 22 and 21 which are on, and the p-channel transistor 12 is turned on among the p-channel transistors 11 and 12 which are off. Therefore, the first connection point 1a shows the Hiz state. In the second transistor group 2, since the signal A having logical "1" is input to the p-channel transistor 13 and to the n-channel transistor 23, the p-channel transistor 13 is off and the n-channel transistor 23 is on. In addition, the signal ADELAY having logical "1" is input from the first delay circuit 41 to the p-channel transistor 14 and to the n-channel transistor 24, the p-channel transistor 14 is off and the n-channel transistor 24 is on. Because the p-channel transistors 13 and 14 are both off and the n-channel transistors 24 and 23 are both on, the second connection point 2a indicates logical "0." Therefore, when the signal B is changed from logical "0" to logical "1" the state of the signal A' is not changed.

Then, the signal A changes its state from logical "1" to logical "0." The signal A which has been changed to the logical "0" state is input to the n-channel transistor 21 and the p-channel transistor 11 in the first transistor group 1. The n-channel transistor 21 goes off and the p-channel transistor 11 goes on. Since the signal B having logical "0" is input through the first inverter 31 to the p-channel transistor 12 and to the n-channel transistor 22, the p-channel transistor 12 is on and the n-channel transistor 22 is off. Because the p-channel transistors 11 and 12 are on and the n-channel transistors 21 and 22 are off, the state of the first connection point 1a is changed from the Hiz state to the logical "1" state. In addition, since the signal A which has been changed to logical "0" is input to the n-channel transistor 23 and to the p-channel transistor 13 in the second transistor group 2, the n-channel transistor 23 goes off and the p-channel transistor 13 goes on. Since the signal ADELAY having logical "1" shown in FIG. 6 is input through the first delay circuit 41 to the p-channel transistor 14 and to the n-channel transistor 24, the p-channel transistor 14 is off and the n-channel transistor 24 is on. Therefore, the state of the second connection point 2a is changed to the Hiz state. Consequently, the signal AN at the sixth connection point 6a has logical "1." The signal AN having logical "1" is inverted by the first latch circuit 37. The signal A' changes its state from logical "1" to logical "0."

The signal A having logical "1" is input through the second inverter 32 to the p-channel transistor 16 and to the n-channel transistor 26 of the third transistor group 3. The p-channel transistor 16 goes off and the n-channel transistor 26 goes on. Since the signal B having logical "1" is input to the p-channel transistor 15 and to the n-channel transistor 25, the p-channel transistor 15 is in the off state and the n-channel transistor 25 is in the on state. Because the p-channel transistors 15 and 16 are both off and the n-channel transistors 26 and 25 are both on, the third connection point 3a has logical "0." Since the fourth connection point 4a is in the Hiz state, the signal BN at the eighth connection point 8a has logical "0." The signal BN having logical "0" is inverted by the second latch circuit 38. The signal B' is changed from logical "0" to logical "1." In this way, in the transition (2), due to the skew between the signals A and B, the signal B changes from logical "0" to logical "1" first, and then the signal A changes from logical "1" to logical "0." In this case, when the signal B changes from logical "0" to logical "1," the states of the output signals A' and B' do not change and remain as they are. When the signal A is changed from logical "1" to logical "0," the states of the output signals A' and B' are changed. Therefore, together with the transition (1), the skew between differential signals having opposite logic levels is reduced.

Next, the transition (3) will be described below. Only the signal A is changed from logical "0" to logical "1."

As shown in FIG. 7, the signal A changes from logical "0" to logical "1." Then, in the first transistor group 1, as shown in FIG. 7, the p-channel transistor 11 is turned off among the p-channel transistors 11 and 12 which are on, and the n-channel transistor 21 is turned on among the n-channel transistors 22 and 21 which are off. Therefore, the first connection point 1a shows the Hiz state. In the second transistor group 2, the p-channel transistor 13 is turned off, and the n-channel transistor 23 is turned on. Since the signal ADELAY having logical "0" is output from the first delay circuit 41 at this point of time, the p-channel transistor 14 is on and the n-channel transistor 24 is off. Therefore, the second connection point 2a also shows the Hiz state. Consequently, the first latch 37 does not change its state, and the signal A' having logical "0" continues being output.

In the third transistor group 3, since the signal A having logical "0" is input through the second inverter 32, the n-channel transistor 26 is turned off among the n-channel transistors 26 and 25 which are on, and the p-channel transistor 16 is turned on among the p-channel transistors 15 and 16 which are off. Therefore, the third connection point 3a shows the Hiz state. Because the fourth connection point 4a also has the Hiz state, the signal B' having logical "1" continues being output.

After the delay period of the first delay circuit 41 elapses, the signal ADELAY having logical "1" is output from the first delay circuit 41. Then, the p-channel transistor 14 is turned off and the n-channel transistor 24 is turned on, and therefore, the second connection point 2a shows logical "0." The state of the logic signal A' is changed from logical "0" to logical "1" through the first latch 37.

Next, the transition (4) will be described below. Only the signal B is changed from logical "1" to logical "0."

When the signal B changes from logical "1" to logical "0," in the third transistor group 3, the n-channel transistor 25 is turned off and the p-channel transistor 15 is turned on. Since the signal A having logical "0" is input through the second inverter 32 to the p-channel transistor 16 and to the n-channel transistor 26, the p-channel transistor 16 is on and the n-channel transistor 26 is off. Therefore, the third connection point 3a shows logical "1."

In the fourth transistor group 4, the n-channel transistor 27 is turned off, and the p-channel transistor 17 is turned on. Since the signal BDELAY having logical "1" is output from the second delay circuit 42 at this point of time, the p-channel transistor 18 is off and the n-channel transistor 28 is on. Therefore, the second connection point 2a shows the Hiz state. Consequently, the eighth connection point 8a shows logical "1" and the signal B' having logical "0" is output through the second latch 38.

The signal B having logical "1" is input through the first inverter 31 to the p-channel transistor 12 and to the n-channel transistor 22 of the first transistor group 1. The p-channel transistor 12 goes off and the n-channel transistor 22 goes on. Since the signal A having logical "1" is input to the p-channel transistor 11 and to the n-channel transistor 21, the p-channel transistor 11 is in the off state and the n-channel transistor 21 is in the on state. Because the p-channel transistors 11 and 12 are both off and the n-channel transistors 22 and 21 are both on, the first connection point 1a has logical "0." Since the second connection point 2a also shows logical "0," the signal AN at the sixth connection point 6a is maintained at logical "0." The signal A' having logical "1" continues being output through the first latch 37.

After the delay period of the second delay circuit 42 elapses, the signal BDELAY having logical "0" is output from the second delay circuit 42. Then, the n-channel transistor 28 is turned off and the p-channel transistor 18 is turned on, and therefore, the state of the eighth connection point 8a is maintained at logical "1." Consequently, the signal B' having logical "0" is maintained.

As described above, when the skew between input signals A and B is less than the delay period of the first and second delay circuits 41 and 42, the differential-signal input and output circuit 10 according to the present embodiment regards the signals A and B as differential signals and operates as a circuit for reducing the skew. When the skew between the input signals A and B is equal to or more than the delay period of the first and second delay circuits 41 and 42, the differential-signal input and output circuit 10 achieves a buffer operation, and outputs the input signals A and B as they are. Therefore, the skew of the differential signals can be reduced and, in addition, signals having logical "0" for a predetermined period, required for identifying packet data, for example, can be output.

In the present embodiment, the first delay circuit has the same delay period as the second delay period. The present invention is not limited to this condition. The delay period of the first delay circuit may be different from that of the second delay circuit. In this case, the skew between two input signals, obtained at the first stage can be processed separately from that obtained at the last stage.

In the present embodiment, the first and second output terminals are connected to the output sides of the first and second latches. The present invention is not limited to this condition. The circuit need to be configured such that the first output terminal is connected to the first connection point and the second connection point, and the second output terminal is connected to the third connection point and the fourth connection point.

As described above, according to the differential-signal input and output circuit of the present invention, differential signals having a small skew are output and signals other than differential signals can be output. In addition, the skew between differential signals caused during signal propagation is reduced.

What is claimed is:

1. A differential-signal input and output circuit comprising:
   two transistor groups each formed of two p-channel transistors and two n-channel transistors connected in series in this order from a power to the ground;
   a first input terminal connected to the gate of a first p-channel transistor of the two p-channel transistors constituting a first transistor group and to the gate of a first n-channel transistor of the two n-channel transistors constituting the first transistor group;
   a first output terminal connected to a first connection point of a p-channel transistor closer to the ground of the two p-channel transistors constituting the first transistor group and an n-channel transistor closer to the power of the two n-channel transistors constituting the first transistor group;
   a second input terminal connected to the gate of a second p-channel transistor of the two p-channel transistors constituting a second transistor group and to the gate of a second n-channel transistor of the two n-channel transistors constituting the second transistor group;
   a second output terminal connected to a connection point of a p-channel transistor closer to the ground of the two p-channel transistors constituting the second transistor group and an n-channel transistor closer to the power of the two n-channel transistors constituting the second transistor group;
   a first inverter whose input side is connected to the second input terminal and whose output side is connected to both of the gate of a third p-channel transistor of the two p-channel transistors constituting the first transistor group, other than the first p-channel transistor, and the gate of a third n-channel transistor of the two n-channel transistors constituting the first transistor group, other than the first n-channel transistor; and
   a second inverter whose input side is connected to the first input terminal and whose output side is connected to both of the gate of a fourth p-channel transistor of the two p-channel transistors constituting the second transistor group, other than the second p-channel transistor, and the gate of a fourth n-channel transistor of the two n-channel transistors constituting the second transistor group, other than the second n-channel transistor.

2. A differential-signal input and output circuit according to claim 2, further comprising a first latch whose input side is connected to the first output terminal; and
   a second latch whose input side is connected to the second output terminal,
       wherein the output point of the first latch serves as the first output terminal; and
       the output point of the second latch serves as the second output terminal.

3. A differential-signal input and output circuit according to claim 2, wherein each of the first latch and the second latch comprises first and second inverters,
   the input of the first inverter serves as the input of each latch,
   the output of the first inverter serves as the output of each latch and is connected to the input of the second inverter, and
   the output of the second inverter is connected to the input of the first inverter.

4. A differential-signal input and output circuit comprising:
   four transistor groups each formed of two p-channel transistors and two n-channel transistors connected in series in this order from a power to the ground;
   a first input terminal connected to all of the gate of a first p-channel transistor of the two p-channel transistors constituting a first transistor group among the four transistor groups, the gate of a first n-channel transistor of the two n-channel transistors constituting the first transistor group, the gate of a second p-channel transistor of the two p-channel transistors constituting a second transistor group among the four transistor groups, and the gate of a second n-channel transistor of the two n-channel transistors constituting the second transistor group;
   a first output terminal connected to both of a first connection point of a p-channel transistor closer to the ground of the two p-channel transistors constituting the first transistor group and an n-channel transistor closer to the power of the two n-channel transistors constituting the first transistor group, and a second connection point of a p-channel transistor closer to the ground of the two p-channel transistors constituting the second transistor group and an n-channel transistor closer to the power of the two n-channel transistors constituting the second transistor group;
   a second input terminal connected to all of the gate of a third p-channel transistor of the two p-channel transistors constituting a third transistor group among the four transistor groups, the gate of a third n-channel transistor of the two n-channel transistors constituting the third transistor group, the gate of a fourth p-channel transistor of the two p-channel transistors constituting a fourth transistor group among the four transistor groups, and the gate of a fourth n-channel transistor of the two n-channel transistors constituting the fourth transistor group;

a second output terminal connected to both of a third connection point of a p-channel transistor closer to the ground of the two p-channel transistors constituting the third transistor group and an n-channel transistor closer to the power of the two n-channel transistors constituting the third transistor group, and a fourth connection point of a p-channel transistor closer to the ground of the two p-channel transistors constituting the fourth transistor group and an n-channel transistor closer to the power of the two n-channel transistors constituting the fourth transistor group;

a first inverter whose input side is connected to the second input terminal and whose output side is connected to both of the gate of a fifth p-channel transistor of the two p-channel transistors constituting the first transistor group, other than the first p-channel transistor, and the gate of a fifth n-channel transistor of the two n-channel transistors constituting the first transistor group, other than the first n-channel transistor;

a first delay circuit whose input side is connected to the first input terminal and whose output side is connected to both of the gate of a sixth p-channel transistor of the two p-channel transistors constituting the second transistor group, other than the second p-channel transistor, and the gate of a sixth n-channel transistor of the two n-channel transistors constituting the second transistor group, other than the second n-channel transistor;

a second inverter whose input side is connected to the first input terminal and whose output side is connected to both of the gate of a seventh p-channel transistor of the two p-channel transistors constituting the third transistor group, other than the third p-channel transistor, and the gate of a seventh n-channel transistor of the two n-channel transistors constituting the third transistor group, other than the third n-channel transistor; and a second delay circuit whose input side is connected to the second input terminal and whose output side is connected to both of the gate of an eighth p-channel transistor of the two p-channel transistors constituting the fourth transistor group, other than the fourth p-channel transistor, and the gate of an eighth n-channel transistor of the two n-channel transistors constituting the fourth transistor group, other than the fourth n-channel transistor.

5. A differential-signal input and output circuit according to claim 4, wherein the first and second delay circuits are formed of inverters connected in a plurality of even-numbered stages.

6. A differential-signal input and output circuit according to claim 4, wherein the input side of the first delay circuit is connected to the output side of the second inverter instead of to the first input terminal, and the input side of the second delay circuit is connected to the output side of the first inverter instead of to the second input terminal.

7. A differential-signal input and output circuit according to claim 6, wherein the first and second delay circuits are formed of inverters connected in a plurality of odd-numbered stages.

8. A differential-signal input and output circuit according to claim 4, further comprising a first latch whose input side is connected to both of the first connection point and the second connection point;

and a second latch whose input side is connected to both of the third connection point and the fourth connection point, wherein the output of each latch serves as an output of the differential-signal input and output circuit.

9. A differential-signal input and output circuit according to claim 8, wherein the first and second delay circuits are formed of inverters connected in a plurality of even-numbered stages.

10. A differential-signal input and output circuit according to claim 8, wherein the input side of the first delay circuit is connected to the output side of the second inverter instead of to the first input terminal, and the input side of the second delay circuit is connected to the output side of the first inverter instead of to the second input terminal.

11. A differential-signal input and output circuit according to claim 10, wherein the first and second delay circuits are formed of inverters connected in a plurality of odd-numbered stages.

12. A differential-signal input and output circuit according to claim 9, wherein each of the first latch and the second latch comprises first and second inverters, the input of the first inverter serves as the input of each latch, the output of the first inverter serves as the output of each latch and is connected to the input of the second inverter, and the output of the second inverter is connected to the input of the first inverter.

13. A differential-signal input and output circuit according to claim 10, wherein each of the first latch and the second latch comprises first and second inverters, the input of the first inverter serves as the input of each latch, the output of the first inverter serves as the output of each latch and is connected to the input of the second inverter, and the output of the second inverter is connected to the input of the first inverter.

14. A differential-signal input and output circuit according to claim 11, wherein each of the first latch and the second latch comprises first and second inverters, the input of the first inverter serves as the input of each latch, the output of the first inverter serves as the output of each latch and is connected to the input of the second inverter, and the output of the second inverter is connected to the input of the first inverter.

15. A differential-signal input and output circuit for receiving a pair of input differential signals comprising:

a first circuit having an input terminal for receiving first input differential signal, an input node for receiving inverted signal of the second input differential signal, and an output terminal for outputting output signal, a second circuit having an input terminal for receiving second input differential signal, an input node for receiving inverted signal of the first input differential signal, and an output terminal for outputting output signal, wherein the first circuit inverts and outputs the first input differential signal and the second circuit inverts and outputs the second input differential signal almost at the same time at timing when whichever of the first and second input differential signals changes the state last changes.

16. A differential-signal input and output circuit for receiving first and second input differential signals comprising:

a first circuit having an input terminal for receiving first input differential signal, an input node for receiving inverted signal of the second input differential signal, an output terminal for outputting output signal, and a first delay circuit for delaying the first input differential signal for a specified period, a second circuit having an input terminal for receiving second input differential signal, an input node for receiving inverted signal of the first input differential signal, an output terminal for outputting output signal, and a second delay circuit for delaying the second input signal for a specified period, wherein the first circuit inverts and outputs the first input differential signal at the same time at timing when whichever changes last changes when the skew between the two input differential signals is less than a delay period specified by a first delay circuit, and operates as just a buffer when the skew is equal to or more than the delay period specified by the first delay circuit, wherein the second circuit inverts and outputs the second input differential signal at the same time at timing when whichever changes last changes when the skew between the two input differential signals is less than a delay period specified by a second delay circuit, and operates as just a buffer when the skew is equal to or more than the delay period specified by the second delay circuit.

* * * * *

UNITED STATES PATENT AND TRADEMARK OFFICE
CERTIFICATE OF CORRECTION

PATENT NO.     : 6,353,340 B1
DATED          : March 5, 2002
INVENTOR(S)    : Takehisa Satoh It is certified that error appears in the above-identified patent and that said Letters Patent is hereby corrected as shown below:

<u>Title page,</u>
Item [73], Assignee, "Kawasaki Steel Corporation", assignee should read
-- Kawasaki Microelectronics, Inc. --

<u>Column 16,</u>
Lines 17 and 18, Claim 2 recitation of "according to claim 2" should read -- according to claim 1 --.

Signed and Sealed this

Twenty-fourth Day of December, 2002

JAMES E. ROGAN
*Director of the United States Patent and Trademark Office*